United States Patent [19]

Payne et al.

[11] Patent Number: 4,811,349

[45] Date of Patent: Mar. 7, 1989

[54] CR³⁺-DOPED COLQUIRIITE SOLID STATE LASER MATERIAL

[75] Inventors: Stephen A. Payne, Castro Valley; Lloyd L. Chase, Livermore; Herbert W. Newkirk, both of Livermore; William F. Krupke, Pleasanton, all of Calif.

[73] Assignee: The United States of America as represented by the United States Department of Energy, Washington, D.C.

[21] Appl. No.: 176,014

[22] Filed: Mar. 31, 1988

[51] Int. Cl.⁴ .............................................. H01S 3/16
[52] U.S. Cl. ....................................... 372/41; 372/39
[58] Field of Search .................................... 372/39–41

[56] References Cited

U.S. PATENT DOCUMENTS

| | | | |
|---|---|---|---|
| 3,997,853 | 12/1976 | Morris et al. | 372/41 |
| 4,272,733 | 6/1981 | Walling et al. | 372/41 |
| 4,377,864 | 3/1983 | McCollum et al. | 372/41 |
| 4,490,822 | 12/1984 | Walling et al. | 372/41 |
| 4,599,727 | 7/1986 | Jenssen | 372/41 |

Primary Examiner—William L. Sikes
Assistant Examiner—B. Randolph
Attorney, Agent, or Firm—Henry P. Sartorio; L. E. Carnahan; Judson R. Hightower

[57] ABSTRACT

Chromium doped colquiriite, $LiCaAlF_6:Cr^{3+}$, is useful as a tunable laser crystal that has a high intrinsic slope efficiency, comparable to or exceeding that of alexandrite, the current leading performer of vibronic sideband $Cr^{3+}$ lasers. The laser output is tunable from at least 720 nm to 840 nm with a measured slop efficiency of about 60% in a Kr laser pumped laser configuration. The intrinsic slope efficiency (in the limit of large output coupling) may approach the quantum defect limited value of 83%. The high slope efficiency implies that excited state absorption (ESA) is negligible. The potential for efficiency and the tuning range of this material satisfy the requirements for a pump laser for a high density storage medium incorporating $Nd^{3+}$ or $Tm^{3+}$ for use in a multimegajoule single shot fusion research facility.

16 Claims, 3 Drawing Sheets

$Cr^{3+}$-DOPED COLQUIRIITE SOLID STATE LASER MATERIAL

The U.S. Government has rights to this invention pursuant to Contract No. W-7405-ENG-48 between the U.S. Department Of Energy and the University of California, for the operation of Lawrence Livermore National Laboratory.

BACKGROUND OF THE INVENTION

The invention relates generally to state lasers and more particularly to chromium doped solid state lasers.

One concept for a 10 MJ fusion research laser uses a gain medium that is pumped to a high stored energy density (greater than 2 J/cc) by a long pulse (greater than 1 msec), efficient (greater than 10%), low cost (less than 1$/cc) laser operating near 800 nm. A phonon terminated chromium doped solid state laser is one possible type of pump laser. Calculational modelling of such lasers advises that ten percent efficient chromium lasers are a reasonable technical goal. The alexandrite chromium laser has the highest known performance (5% efficient, projected cost 2–4$/cc); it is believed to be limited in efficiency to 5% by small, but significant excited state absorption (ESA) losses. Accordingly, it would be desirable to find a 10% efficiency chromium laser (with reduced ESA and other losses) and that otherwise has the potential to meet the cost goal.

The detrimental effects of excited state absorption (ESA) have been investigated for the case of solid state lasers based on the $d^3$ impurities, $Cr^{3+}$ and $V^{2+}$. It was shown that the infrared ESA band overlaps the emission band, thereby reducing the efficiency of the $Na_3Ga_2Li_3F_{12}:Cr^{3+}$ and $KMgF_3:V^{2+}$ lasers. A fundamental understanding of this ESA band was devised in terms of lattice relaxation around the impurity site and its consequences. Within the context of this model, it was determined that the best fluoride laser hosts for $Cr^{3+}$ would involve: (a) the crystal sites affording the highest possible crystal field strength commensurate with $^4T_2$-$^4A_2$ emission, and (b) small substitutional sites in lattices with the greatest amount of stiffness. These criteria are compatible with the materials that are expected to have the best thermo-mechanical properties. Additionally, it appears that crystals that offer only a single type of $Cr^{3+}$ site are "safer", as the chance of one of the sites having unsuitable spectroscopic properties is substantial. Thus, it would be desirable to find a fluoride crystal which satisfied all of these requirements.

One particular fluoride crystal, colquiriite (LiCaAlF$_6$), has been previously considered as a possible $Nd^{3+}$, $Cr^{3+}$ co-doping candidate, in which the Cr ion is used for sensitization of the Nd laser. As a sensitizer the Cr ion absorbs some of the pump energy and transfers energy to the Nd ion to excite the Nd ion to produce laser action of the Nd ion. Colquiriite is known to have good $Cr^{3+}$ fluorescence properties and to grow in single crystal form.

SUMMARY OF THE INVENTION

Accordingly, it is an object of the invention to provide a chromium solid state laser.

It is another object of the invention to provide a chromium doped solid state laser medium.

It is also an object of the invention to provide a chromium doped fluoride crystal laser material.

It is a further object of the invention to provide a chromium doped fluoride solid state laser having a slope efficiency comparable to an alexandrite chromium laser.

The invention is a chromium doped colquiriite $Cr^{3+}$:LiCaAlF$_6$ laser material and laser. The chromium doped colquiriite laser is tunable over a wide range, 720 nm to 840 nm, and has a slope efficiency comparable to alexandrite. The invention includes the growth of large single crystals of Cr:colquiriite, up to or exceeding 1 cc, by the horizontal zone melting method. Other related crystals and other growth methods may also be used.

DETAILED DESCRIPTION OF THE PREFERRED EMBODIMENTS

The invention is a solid state laser material comprising chromium doped colquiriite $Cr^{3+}$:LiCaAlF$_6$, and a chromium laser formed from the chromium doped colquiriite laser material. The Cr:colquiriite laser can be flashlamp pumped, has a high slope efficiency comparable to the alexandrite laser, has a free running laser wavelength around 778 nm and is tunable over a range of at least 720 nm to 840 nm.

The Cr:colquiriite is synthetically grown as a single large crystal by applying known techniques, e.g. the horizontal zone melting method. The $Cr^{3+}$ concentration is typically about 1 mole % (mole fraction) and more generally about 0.5–5 mole %; concentrations of 0.3–1.1 mode % have been used. Crystals of about 1 cc size can be formed. Colquiriite crystal has one great advantage over alexandrite in that it is a much less expensive material. Colquiriite is made from the binary fluorides LiF, CaF$_2$, AlF$_3$ which are inexpensive and abundant. Although not as hard as alexandrite (which is an oxide), colquiriite has adequate mechanical properties, which when combined with its low cost, make it an ideal laser material.

A boule of LiCaAlF$_6$ containing about 1 mole % $Cr^{3+}$ in the melt was synthesized by first hydrofluorinating the stoichiometric mixture of previously zone refined and purified powdered binary fluorides in a platinum boat at 850° C. for six hours, (M.P. —825° C.) and then adding CrF$_3$ at a level of about 1 mole %. The fused boule then received two passes under argon in the zone melting station, first at 30 mm/hour and the final pass at 5 mm/hour to increase the crystal perfection. Portions of the boule were found to provide clear single crystal samples, and were confirmed to be phase-pure by X-ray analysis.

Figure 1A:
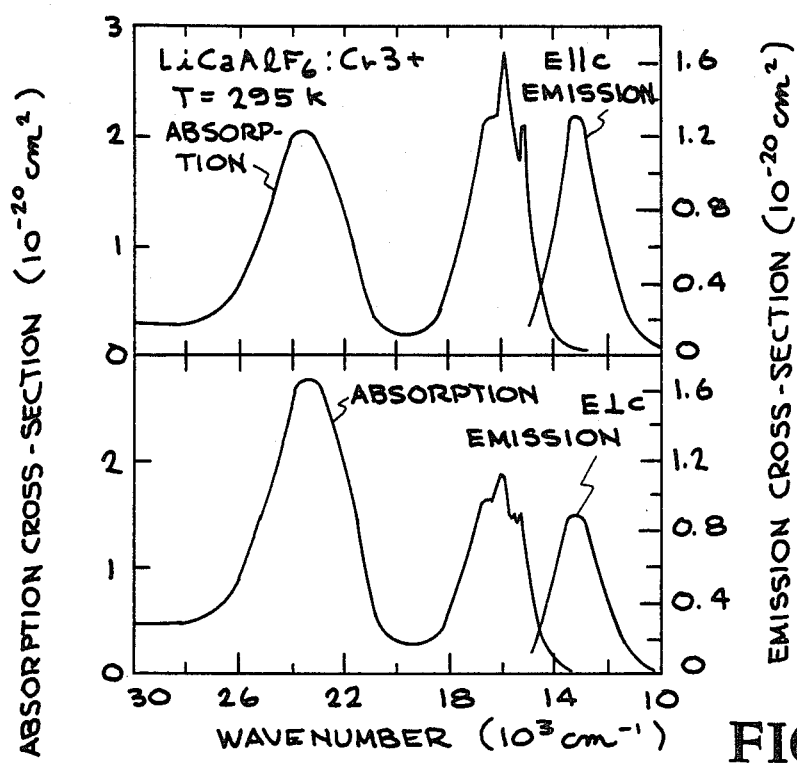
FIG. 1A shows the absorption and emission spectra of Cr:colquiriite for electric field polarization parallel and perpendicular to the c axis of the crystal.

Spectroscopic measurements of chromium doped colquiriite at 295K appear in FIGS. 1A, B. The absorption spectra in FIG. 1A represent quintessential $Cr^{3+}$ behavior; the two broad bands at 15,900 cm$^{-1}$ and 23,500 cm$^{-1}$ are the transitions from the $^4A_2$ ground state to the $^4T_2$ and $^4T_2$ excited states, respectively. The emission is peaked at 13,160 cm$^{-1}$ (760 nm), a rather short wavelength for a fluoride host, indicating the presence of a strong crystal field and that the nearest-neighbor fluorides are rigidly bound and resist strong relaxation. Since the colquiriite crystal is uniaxial, polarized spectra with the electric field parallel and perpendicular to the c axis are shown in FIG. 1A.

An absolute cross-section scale is indicated for the emission bands of FIG. 1A, showing that $E \parallel C$ is strongly preferred. The peak cross-section of $1.3 \times 10^{-20}$ cm$^2$ is substantial compared to most $Cr^{3+}$ systems, owing in part to the polarized nature of the emission. This produces a 30% increase in the cross-section, compared to the value that would be obtained for the hypothetical isotropic emitter.

There is no residual absorption in the emission wavelength region; i.e. $LiCaAlF_6$:$Cr^{3+}$ is a "clean" system. This is due to the fact that the $Cr^{3+}$ ions are unlikely to appear on the $Li^+$ and $Ca^{2+}$ sites, and also because all the metal sites are approximately octahedral in coordination, and as a result, the d—d transitions are always forbidden.

Figure 1B:
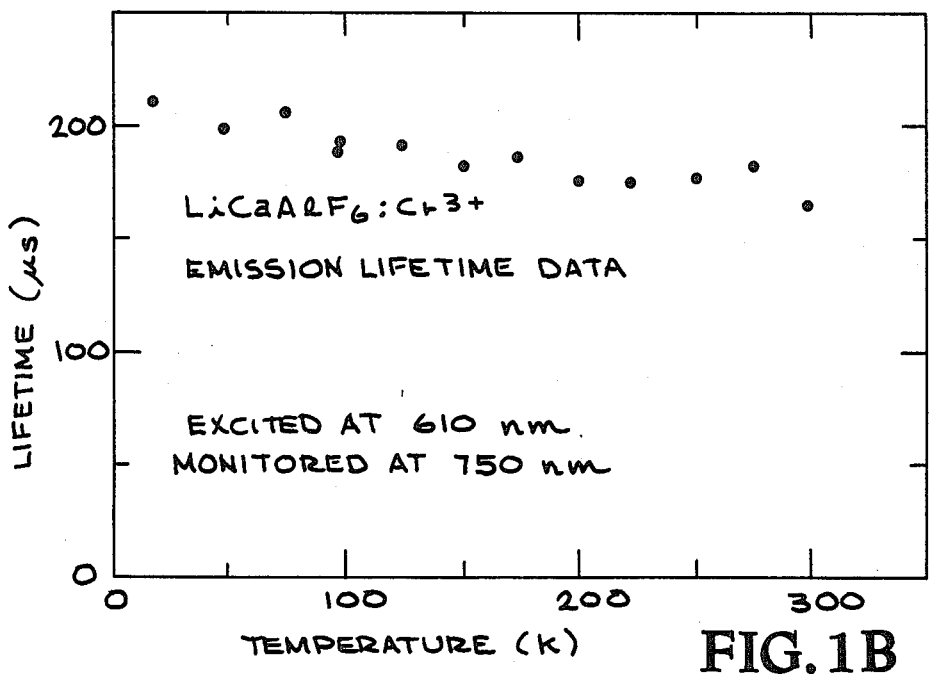
FIG. 1B is a plot of emission lifetime data of Cr:colquiriite as a function of temperature.

As shown in FIG. 1B, the decay times monitored at 750 nm for material excited at 610 nm vary smoothly from about 200 $\mu$s at very low temperature (near 20° K.) to 170 $\mu$s near room temperature. The absence of an abrupt change indicates that it is unlikely that nonradiative decay is of any significance in the $LiCaAlF_6$:$Cr^{3+}$ system. Therefore, the quantum yield is assumed to be unity by inference, and by analogy with the $Na_3Ga_2$. $Li_3F_{12}$:$Cr^{3+}$ system.

Figure 2A:
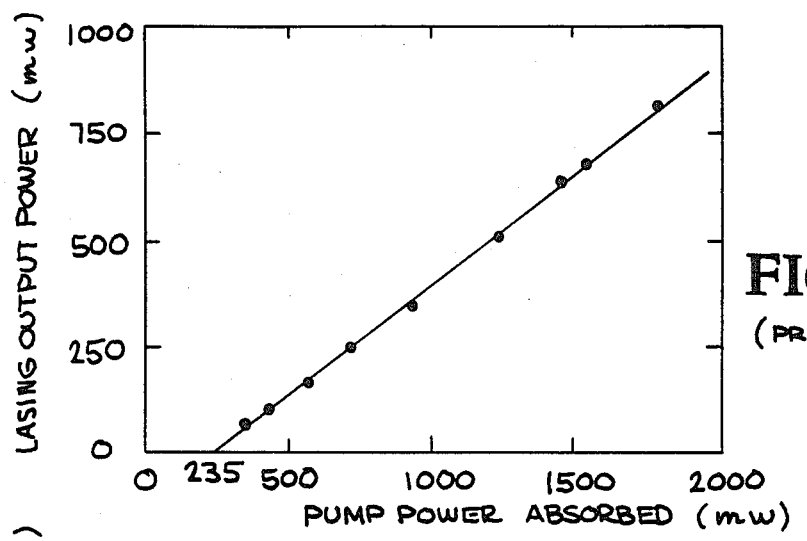
FIGS. 2A, B are plots of the slope efficiency of alexandrite and Cr:colquiriite, respectively.
Figure 2B:
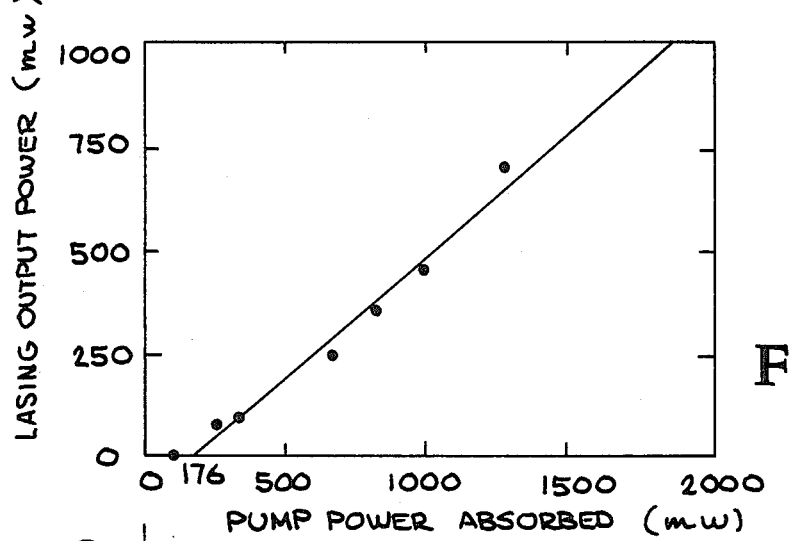
FIG. 2C shows the free running spectral output of the Cr:colquiriite laser.

In FIGS. 2A, B laser slope efficiency measurements of alexandrite and colquiriite are compared. The $Kr^+$ laser line at 647 nm was used to pump the $Cr^{3+}$-doped samples. In FIG. 2A, the slope efficiency obtained for an alexandrite sample is 52% using 5.16% output coupling. This material is currently considered the best $Cr^{3+}$ laser. Presumably, small amounts of sample scattering, absorptive losses, and the 5% output coupling limit us from realizing the maxium attainable (intrinsic) slope efficiency of about 68% (this value takes the minor amount of ESA at 750 nm into account). Under nearly the same conditions (4.32% output coupling), the results obtained for colquiriite give a slope efficiency of 60%, as seen in FIG. 2B. The data in FIG. 2B are typical. For a perfect crystal and resonator, and with negligible ESA and nonradiative decay losses, the quantum-limited slope efficiency for colquiriite is anticipated to be 83%.

Figure 2C:
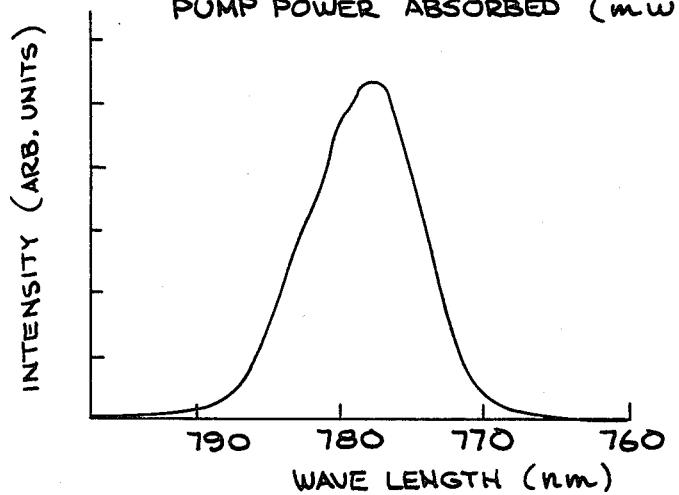
Figure 3:
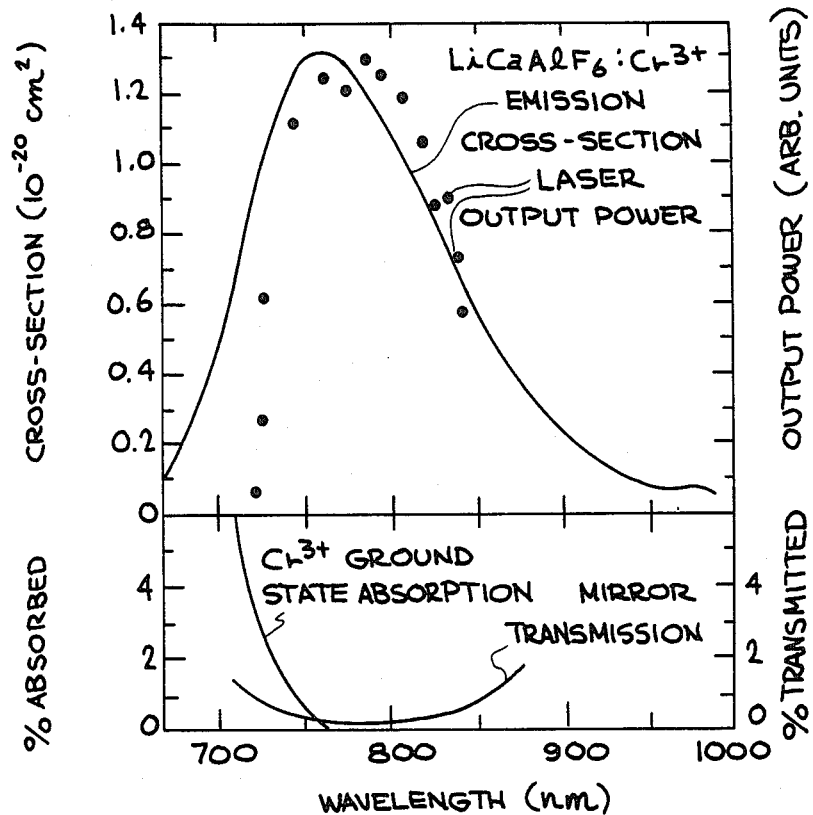
FIG. 3 illustrates the output power of the Cr:colquiriite laser as a function of wavelength, with the emission cross section, output mirror transmission, and $Cr^{3+}$ ground state absorption.

In FIG. 2C, the free-running spectral output of the colquiriite laser is displayed. In the absence of a tuning element the output spectrum is found to be quite broad. The peak is at 780 nm rather than 760 nm, as predicted by the emission data in FIG. 1A, probably because of the slightly different reflectivity of the cavity mirrors at the longer wavelength. A birefringent filter was placed in the laser cavity to select the wavelength. FIG. 3 plots values of the output power (shown as dots) as a function of wavelength. The laser was tunable from 720 nm to 840 nm. The free spectral range of the filter was too small, however, to select wavelengths beyond 840 nm. When this was attempted, lasing shifted back to the short-wavelength side of the tuning curve. The emission cross section is shown as the solid curve in the upper frame of FIG. 3, and the output mirror transmission and $Cr^{3+}$ ground state absorption are in the lower frame. It is likely that the onset of ground state absorption determines the short-wavelength limit of laser operation. Only ESA and the gain bandwidth are expected to influence the long-wavelength limit.

The $LiCaAlF_6$ host appears quite promising as a laser material. Qualitatively, the thermo-mechanical properties should be favorable, since they are most likely similar to those of the constituents of colquiriite: LiF, $CaF_2$, $AlF_3$. In addition, a degree of flexibility in material development still remains, in that related crystals can be fabricated by substituting $Ba^{2+}$, $Sr^{2+}$, $Cd^{2+}$, or $Mg^{2+}$ for $Ca^{2+}$, $Sc^{3+}$ or $Ga^{3+}$ for $Al^{3+}$ and $Rb^+$, $K^+$, or $Na^+$ for $Li^+$. Also, a sensitizer such as $Eu^{2+}$, $Pb^{2+}$, $Ce^{3+}$, $Yb^{2+}$, $Cu^+$ or combinations thereof may be used for providing increased absorption in the UV up to 400 nm, and subsequently transferring the energy to the $Cr^{3+}$ activators. The sensitizer concentration is typically about 0.1–10 mole percent, depending on the particular ion. Filling-in the gap between the two pump bands pictured in FIG. 1A is more problematical, as $Mn^{2+}$ or $Sm^{2+}$ seems to be the only possibility, and its long lifetime and low oscillator strength give a low probability of success. However, a flashlamp coating in this region can help by reflecting these wavelengths back into the flashlamp plasma. In general, the use of sensitizer ions and/or a flashlamp coating is likely to improve the efficiency of this laser.

Figure 4:
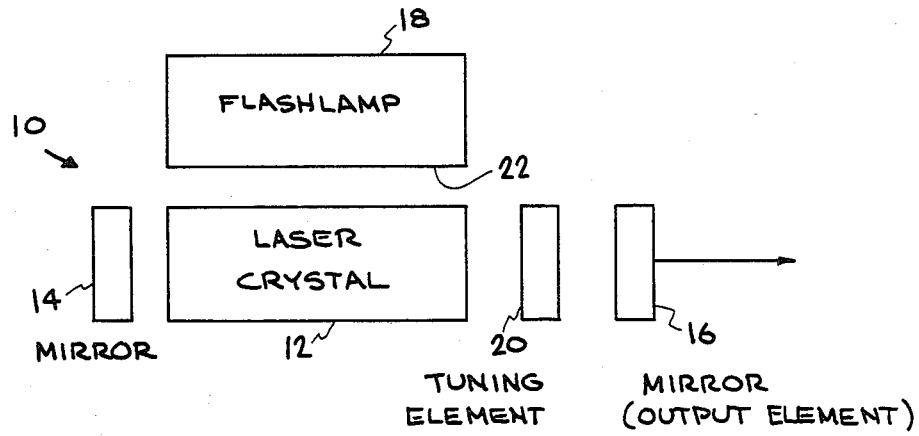
FIG. 4 is a schematic diagram of a Cr:colquiriite laser.

A schematic diagram of a chromium doped colquiriite laser according to the invention is shown in FIG. 4. Laser 10 is formed of a chromium doped colquiriite crystal 12 placed between a pair of aligned mirrors 14, 16 or other cavity forming means to form a resonator. Excitation means such as flashlamp 18 are placed in proximity to crystal 12 to pump the laser. Mirror 16 is partly transmitting to the laser wavelength to provide the output coupling or energy extraction means while mirror 14 is highly reflecting. A tuning element 20 such as filter may also be placed in the resonant cavity to select or limit the range of laser wavelengths. Since the crystal 12 does not absorb much energy in the band between the absorption peaks shown in FIG. 1A, flashlamp 18 may be coated with a coating 22 which is reflective at the nonabsorbed wavelengths so that this energy is returned into the flashlamp plasma.

Changes and modifications in the specifically described embodiments can be carried out without departing from the scope of the invention which is intended to be limited only by the scope of the appended claims.

We claim:
1. A solid state laser material, comprising:
    a colquiriite ($LiCaAlF_6$) crystal;
    a $Cr^{3+}$ dopant in the crystal.
2. The laser material of claim 1 wherein the $Cr^{3+}$ dopant has a concentration of about 0.5–5 mole percent.
3. The laser material of claim 1 wherein the colquiriite crystal is a synthetically grown single crystal.
4. The laser material of claim 3 wherein the crystal has a volume of at least about 1 cc.
5. The laser material of claim 1 further comprising a sensitizer in the crystal to increase flashlamp pumping efficiency.
6. A solid state laser material, comprising:
    a crystal of the composition $XYZF_6$ wherein X is selected from $Li^+$, $Na^+$, $K^+$, and $Rb^+$, Y is se- lected from $Ca^{2+}$, $Sr^{2+}$, $Ba^{2+}$, $Cd^{2+}$, and $Mg^{2+}$, and Z is selected from $Al^{3+}$, $Ga^{3+}$, and $Sc^{3+}$;

a $Cr^{3+}$ dopant in the crystal.

7. The laser material of claim 6 wherein the $Cr^{3+}$ dopant has a concentration of about 0.5-5 mole percent.

8. The laser material of claim 6 further comprising a sensitizer in the crystal to increase flashlamp pumping efficiency.

9. A chromium solid state laser, comprising:

a chromium doped fluoride laser crystal of the composition $Cr^{3+}:XYZF_6$ wherein X is selected from $Li^+$, $Na^+$, $K^+$, and $Rb^+$, Y is selected from $Ca^{2+}$, $Sr^{2+}$, $Ba^{2+}$, $Cd^{2+}$, and $Mg^{2+}$, and Z is selected from $Al^{3+}$, $Ga^{3+}$, and $Sc^{3+}$;

excitation means associated with the crystal for pumping the crystal;

cavity forming means surrounding the crystal to form a resonant laser cavity;

energy extraction means associated with the cavity forming means to remove laser energy from the cavity.

10. The laser of claim 9 wherein the crystal is a chromium doped colquiriite laser crystal ($Cr^{3+}:LiCaAlF_6$).

11. The laser of claim 10 having a slope efficiency of about 60%.

12. The laser of claim 10 which is tunable over the range of at least 720 nm to 840 nm.

13. The laser of claim 9 wherein the excitation means is a flashlamp.

14. The laser of claim 13 wherein the flashlamp includes a coating reflective at wavelengths not strongly absorbed by the crystal.

15. The laser of claim 9 further comprising a tuning means placed in the cavity.

16. The laser of claim 9 further comprising a sensitizer in the crystal.

* * * * *